US008655651B2

(12) United States Patent
Grancharov et al.

(10) Patent No.: US 8,655,651 B2
(45) Date of Patent: Feb. 18, 2014

(54) METHOD, COMPUTER, COMPUTER PROGRAM AND COMPUTER PROGRAM PRODUCT FOR SPEECH QUALITY ESTIMATION

(75) Inventors: Volodya Grancharov, Solna (SE); Mats Folkesson, Täby (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 83 days.

(21) Appl. No.: 13/384,882

(22) PCT Filed: Jul. 26, 2010

(86) PCT No.: PCT/SE2010/050867
§ 371 (c)(1),
(2), (4) Date: Jan. 19, 2012

(87) PCT Pub. No.: WO2011/010962
PCT Pub. Date: Jan. 27, 2011

(65) Prior Publication Data

US 2012/0116759 A1 May 10, 2012

Related U.S. Application Data

(60) Provisional application No. 61/228,212, filed on Jul. 24, 2009.

(51) Int. Cl.

| | |
|---|---|
| ***G10L 25/00*** | (2013.01) |
| ***G10L 19/00*** | (2013.01) |
| ***G10L 19/12*** | (2013.01) |
| ***G10L 21/00*** | (2013.01) |
| ***G10L 19/02*** | (2013.01) |
| ***H04R 29/00*** | (2006.01) |
| ***H03G 3/20*** | (2006.01) |
| ***H04B 17/02*** | (2006.01) |

(52) U.S. Cl.
USPC ........... 704/226; 704/200; 704/201; 704/222; 704/223; 381/56; 381/110; 455/134; 455/135

(58) Field of Classification Search
None
See application file for complete search history.

(56) References Cited

U.S. PATENT DOCUMENTS

| | | | | |
|---|---|---|---|---|
| 6,064,966 A * | 5/2000 | Beerends | ...................... | 704/500 |
| 6,609,092 B1 * | 8/2003 | Ghitza et al. | .................. | 704/226 |
| 7,016,814 B2 * | 3/2006 | Beerends et al. | ............. | 702/189 |
| 7,305,341 B2 * | 12/2007 | Kim | ............................. | 704/259 |

(Continued)

OTHER PUBLICATIONS

Yi Hu; Loizou, P.C., "Evaluation of Objective Quality Measures for Speech Enhancement," Audio, Speech, and Language Processing, IEEE Transactions on , vol. 16, No. 1, pp. 229,238, Jan. 2008.*

(Continued)

*Primary Examiner* — Edgar Guerra-Erazo
*Assistant Examiner* — Thuykhanh Le
(74) *Attorney, Agent, or Firm* — Myers Bigel Sibley & Sajovec, P.A.

(57) ABSTRACT

The invention relates to a method, computer, computer program and computer program product for speech quality estimation. The method comprises the steps of: determining a coding distortion parameter ($Q_{COD}$), a bandwidth related distortion parameter (BW) and a presentation level distortion parameter (PL) of a speech signal; extracting a first coefficient ($\omega_1$) and a second coefficient ($\omega_2$), the first coefficient and the second coefficient being dependent on the coding distortion parameter; and calculating a signal quality measure (Q), where the signal quality measure is $Q_{COD}+\omega_1 BW+\omega_2 PL$ using the signal quality measure in a quality estimation of the speech signal.

14 Claims, 7 Drawing Sheets

(56) References Cited

U.S. PATENT DOCUMENTS

| | | | | |
|---|---|---|---|---|
| 7,624,008 | B2 * | 11/2009 | Beerends et al. | 704/225 |
| 7,664,231 | B2 * | 2/2010 | Schmidmer et al. | 379/1.02 |
| 2002/0191798 | A1 | 12/2002 | Juric et al. | |
| 2004/0042617 | A1 * | 3/2004 | Beerends et al. | 379/416 |
| 2004/0186731 | A1 * | 9/2004 | Takahashi et al. | 704/277 |
| 2006/0126798 | A1 * | 6/2006 | Conway | 379/1.03 |
| 2006/0200346 | A1 * | 9/2006 | Chan et al. | 704/233 |
| 2007/0011006 | A1 * | 1/2007 | Kim | 704/233 |
| 2007/0233469 | A1 * | 10/2007 | Chen et al. | 704/207 |
| 2008/0040102 | A1 | 2/2008 | Beerends | |
| 2009/0018825 | A1 | 1/2009 | Bruhn et al. | |
| 2011/0305345 | A1 * | 12/2011 | Bouchard et al. | 381/23.1 |
| 2012/0020484 | A1 * | 1/2012 | Grancharov | 381/56 |

OTHER PUBLICATIONS

Grancharov, V.; Zhao, D.Y.; Lindblom, J.; Kleijn, W.B., "Low-Complexity, Nonintrusive Speech Quality Assessment," Audio, Speech, and Language Processing, IEEE Transactions on , vol. 14, No. 6, pp. 1948,1956, Nov. 2006.*

Rix, A.W.; Beerends, J.G.; Hollier, M.P.; Hekstra, A.P., "Perceptual evaluation of speech quality (PESQ)—a new method for speech quality assessment of telephone networks and codecs," Acoustics, Speech, and Signal Processing, 2001. Proceedings. (ICASSP '01). 2001 IEEE International Conference on , vol. 2, No., pp. 749,752 vol. 2, 2001.*

Lijing Ding; Goubran, R.A., "Speech quality prediction in VoIP using the extended E-model," Global Telecommunications Conference, 2003. GLOBECOM '03. IEEE , vol. 7, No., pp. 3974,3978 vol. 7, Dec. 1-5, 2003.*

International Search Report, PCT Application No. PCT/SE2010/050867, Nov. 19, 2010.

Written Opinion of the international Searching Authority, PCT Application No. PCT/SE2010/050867, Nov. 18, 2010.

Cote et al., "Influence of loudness level on the overall quality of transmitted speech," in Proceedings of the 123$^{rd}$ Audio Engineering Society Convention (AES '07), Dec. 2007.

Haojun et al., "A wideband speech codecs quality measure based on bark spectrum distance", Intelligent Signal Processing and Communication Systems, 2004. ISPACS 2004. Proceedings of 2004 International Symposium on Seoul, Korea Nov. 18-19, 2004, Piscataway, NJ, USA, IEEE, p. 155-158, ISBN 978-0-7803-8639-6; ISBN 0-7803-8639-6.

* cited by examiner

METHOD, COMPUTER, COMPUTER PROGRAM AND COMPUTER PROGRAM PRODUCT FOR SPEECH QUALITY ESTIMATION

CROSS REFERENCE TO RELATED APPLICATIONS

This application is a 35 U.S.C. §371 national stage application of PCT International Application No. PCT/SE2010/050867, filed on 26 Jul. 2010, which itself claims priority to U.S. provisional Patent Application No. 61/228,212, filed 24 Jul. 2009, the disclosure and content of both of which are incorporated by reference herein in their entirety. The above-referenced PCT International Application was published in the English language as International Publication No. WO 2011/010962 A1 on 27 Jan. 2011.

TECHNICAL FIELD

The invention relates to speech quality estimation, and more particularly to a method, a computer program, a computer program product, and a computer for speech quality estimation.

BACKGROUND

Bandwidth limitations and signal presentation level variations affect the overall perception of speech quality. Presentation level is the active speech level at the listener side. How to measure active speech level is described in [1] ITU-T Rec. P. 56 (March 1993) Objective measurement of Active Speech Level.

If the bandwidth and the presentation level variations are the only source of degradation, they can be related in a simple way to speech quality; the signals with larger bandwidth and higher presentation level have higher quality and vice versa. However, in the case of typical coding artifacts, this relation becomes highly non-linear, and limiting the signal bandwidth and/or decreasing presentation level might lead to quality improvement. This effect is difficult to capture by the conventional quality assessment schemes, such as those disclosed in the following documents [2]-[6] below:

[2] ITU-T Rec. P.862 (February 2001), Perceptual evaluation of speech quality (PESQ), an objective method for end-to-end speech quality assessment in narrow-band telephone networks and speech codecs;

[3] ITU-T Rec. P.862.2 (November 2005), Wideband extension to Recommendation P.862 for the assessment of wideband telephone networks and speech codecs;

[4] ANSI T1.518-1998 (R2003), Objective Measurement of Telephone Band Speech Quality Using Measuring Normalizing Blocks;

[5] ITU-T P. 563 (May 2004), Single ended method for objective speech quality assessment in narrow-band telephony applications; and

[6] ITU-R Rec. BS.1387-1 (November 2001), Method for objective measurements of perceived audio quality.

Presentation level is related to the signal loudness, typically measured according to ITU-T Rec. P.56 speech level meter described in [1]. An example of a signal at different presentation levels is shown in FIG. 1 of this application.

Signal bandwidth is the range of frequencies beyond which the frequency function is close to zero (e.g. 10-20 dB below max frequency value). Example of a super-wideband signal (50-14000 Hz), processed with NB (narrowband) IRS (Intermediate Reference System) filter is given in FIG. 2. IRS defines sending/receiving characteristics of NB codecs and other NB systems. It defines a band-pass filter that attenuates below 300 Hz and above 3400 Hz and is described in [7] ITU-T Rec. P.48, Telephone Transmission Quality, Transmission Standards, Specification for an Intermediate Reference System.

SUMMARY

An object of the invention is to improve speech quality estimation, i.e. improve the assessment of speech quality of a speech signal.

The invention relates to a method performed by a computer for speech quality estimation. The method comprises the steps of:

determining a coding distortion parameter, $Q_{COD}$, a bandwidth related distortion parameter, BW, and a presentation level distortion parameter, PL, of a speech signal;

extracting a first coefficient, $\omega_1$, and a second coefficient, $\omega_2$, where $\omega_1$ and $\omega_2$ are dependent on $Q_{COD}$; and calculating a signal quality measure, Q, where Q is $$Q_{COD}+\omega_1 \cdot BW+\omega_2 PL, \text{ and}$$

using the Q in a quality estimation of the speech signal.

Hereby bandwidth limitations and presentation level variations are taken into account. The invention presents a scheme that can capture the non-linear relation between a coding noise, a bandwidth variation, and a presentation level variation, but is still simple and thus generalizes better with unknown data. In this way the effects of BW and PL can be incorporated in a more general quality assessment scheme, without causing problems related to data overfitting.

In one embodiment of the method, the step of extracting $\omega_1$ and $\omega_2$ is performed by calculating $\omega_i=$ $$\|Q_{COD}-\gamma_i\|^{\alpha_i} \text{ for } Q_{COD}>\gamma_i$$

where i={1, 2} and wherein γ and α are trained or empirically determined coefficients.

In one embodiment of the method, the step of extracting $\omega_1$ and $\omega_2$ is performed by calculating $\omega_i=$ $$-\|Q_{COD}-\gamma_i\|^{\beta_i} \text{ for } Q_{COD}<\gamma_i$$

where i={1, 2} and wherein γ and β are trained or empirically determined coefficients.

In one embodiment of the method, the step of extracting $\omega_1$ and $\omega_2$ is performed by calculating $\omega_1$ and $\omega_2$ according to $$\omega_i = \begin{cases} \|Q_{COD}-\gamma_i\|^{\alpha_i} & \text{if } Q_{COD} > \gamma_i \\ -\|Q_{COD}-\gamma_i\|^{\beta_i} & \text{if } Q_{COD} < \gamma_i \\ 0 & \text{if } Q_{COD} = \gamma_i \end{cases}$$

where i={1, 2} and γ, α and β are trained or empirically determined coefficients.

$Q_{COD}$ may be determined by extracting $Q_{COD}$ from $$\frac{1}{N}\sum_{n=1}^{N}\frac{\exp\left(\frac{1}{W}\sum_{f=1}^{W}\log(P(n,f))\right)}{\frac{1}{W}\sum_{f=1}^{W}P(n,f)}$$

wherein N is a number of frames or blocks in the speech signal and W is a number of frequency bands wherein the N and the W are related to a codec bit rate with n being a time frame, frame index or frame counter value and f being a frequency counter or band index value, and P represents power spectrum of the speech signal.

Q may in one embodiment of the method be used to monitor a communications network and detect failed network nodes;

optimize network configuration for the communications network for best perception quality;

optimize a speech codec;

optimize noise suppression systems; or assess floating and fixed point implementation of speech quality estimation procedures.

The invention also relates to a computer for speech quality estimation. The computer is adapted to be connected to a communications network and comprises:

a determining unit configured to determine a $Q_{COD}$, a BW and a PL of a speech signal;

an extracting unit configured to extract $\omega_1$ and $\omega_2$, where $\omega_1$ and $\omega_2$ are dependent on $Q_{COD}$, a calculating unit configured to calculate a Q, where the Q= $Q_{COD}+\omega_1\cdot BW+\omega_2\cdot PL$, and an output unit configured to output Q in order for the Q to be stored in a second computer.

The computer may comprise a speech quality estimation unit configured to use Q to estimate a speech quality of the speech signal.

The computer may comprise an input unit for receiving an original signal and a processed signal of the original signal.

The extracting unit of the computer may be configured to extract $\omega_1$ and $\omega_2$ by calculating $\omega_i$=

$$\|Q_{COD}-\gamma_i\|^{\alpha_i} \text{ for } Q_{COD}>\gamma_i$$

where i={1, 2} and wherein γ and α are trained or empirically determined coefficients.

The extracting unit of the computer may be configured to extract $\omega_1$ and $\omega_2$ by calculating $\omega_i$=

$$-\|Q_{COD}-\gamma_i\|^{\beta_i} \text{ for } Q_{COD}<\gamma_i$$

where i={1, 2} and wherein γ and β are trained or empirically determined coefficients.

Moreover the invention relates to a computer program for speech quality estimation. The computer program comprises code means which when run on a computer connected to a communications network causes the computer to:

determine a $Q_{COD}$, a BW and a PL of a speech signal;

extract a $\omega_1$ and a $\omega_2$, where $\omega_1$ and $\omega_2$ being dependent on $Q_{COD}$, calculate a Q, where Q=

$$Q_{COD}+\omega_1\cdot BW+\omega_2\cdot PL; \text{ and}$$

use Q in a quality estimation of the speech signal.

The computer program may comprise code means which when run on the computer causes the computer to extract $\omega_1$ and $\omega_2$ by calculating $\omega_1$ and $\omega_2$ according to $$\omega_i = \begin{cases} \|Q_{COD}-\gamma_i\|^{\alpha_i} & \text{if } Q_{COD} > \gamma_i \\ -\|Q_{COD}-\gamma_i\|^{\beta_i} & \text{if } Q_{COD} < \gamma_i \\ 0 & \text{if } Q_{COD} = \gamma_i \end{cases}$$

where i={1, 2} and γ, α and β are trained or empirically determined coefficients.

The computer program may comprise code means which when run on the computer causes the computer to determine $Q_{COD}$ by extracting $Q_{COD}$ from $$\frac{1}{N}\sum_{n=1}^{N}\frac{\exp\left(\frac{1}{W}\sum_{f=1}^{W}\log(P(n,f))\right)}{\frac{1}{W}\sum_{f=1}^{W}P(n,f)}$$

wherein N is a number of frames or blocks in the speech signal and W is a number of frequency bands wherein the N and the W are related to a codec bit rate with n being a time frame, frame index or frame counter value and f being a frequency counter or band index value, and P represents power spectrum of the speech signal.

Furthermore the invention relates to a computer program product comprising computer readable code means and the computer program, which is stored on the computer readable means.

BRIEF DESCRIPTION OF THE DRAWINGS

The objects, advantages and effects as well as features of the present invention will be more readily understood from the following detailed description of exemplary embodiments of the invention when read together with the accompanying drawings, in which.

DETAILED DESCRIPTION

Figure 1:
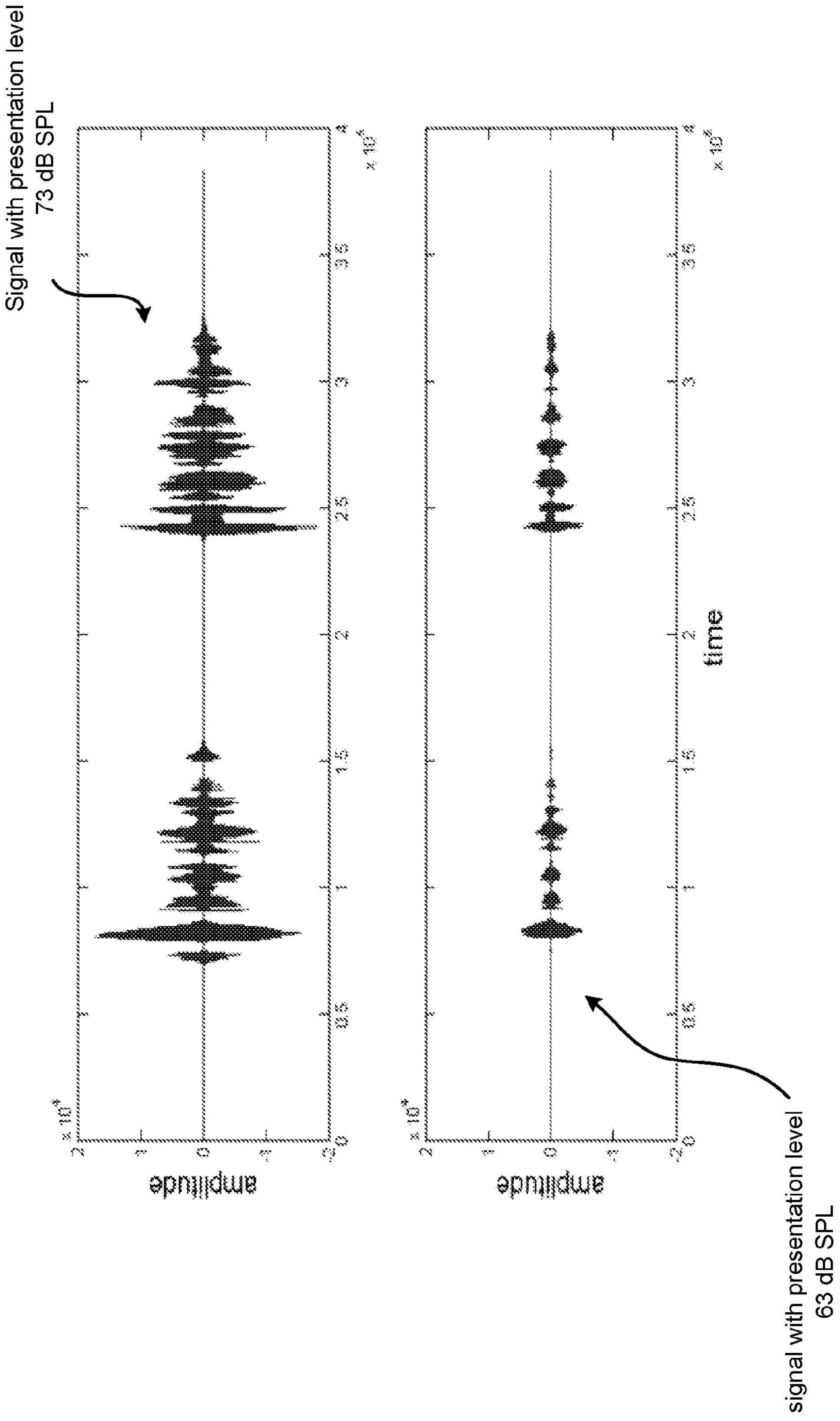
FIG. 1 shows a signal with presentation level 73 dB SPL (top) and another signal with presentation level 63 dB SPL (bottom).
Figure 2:
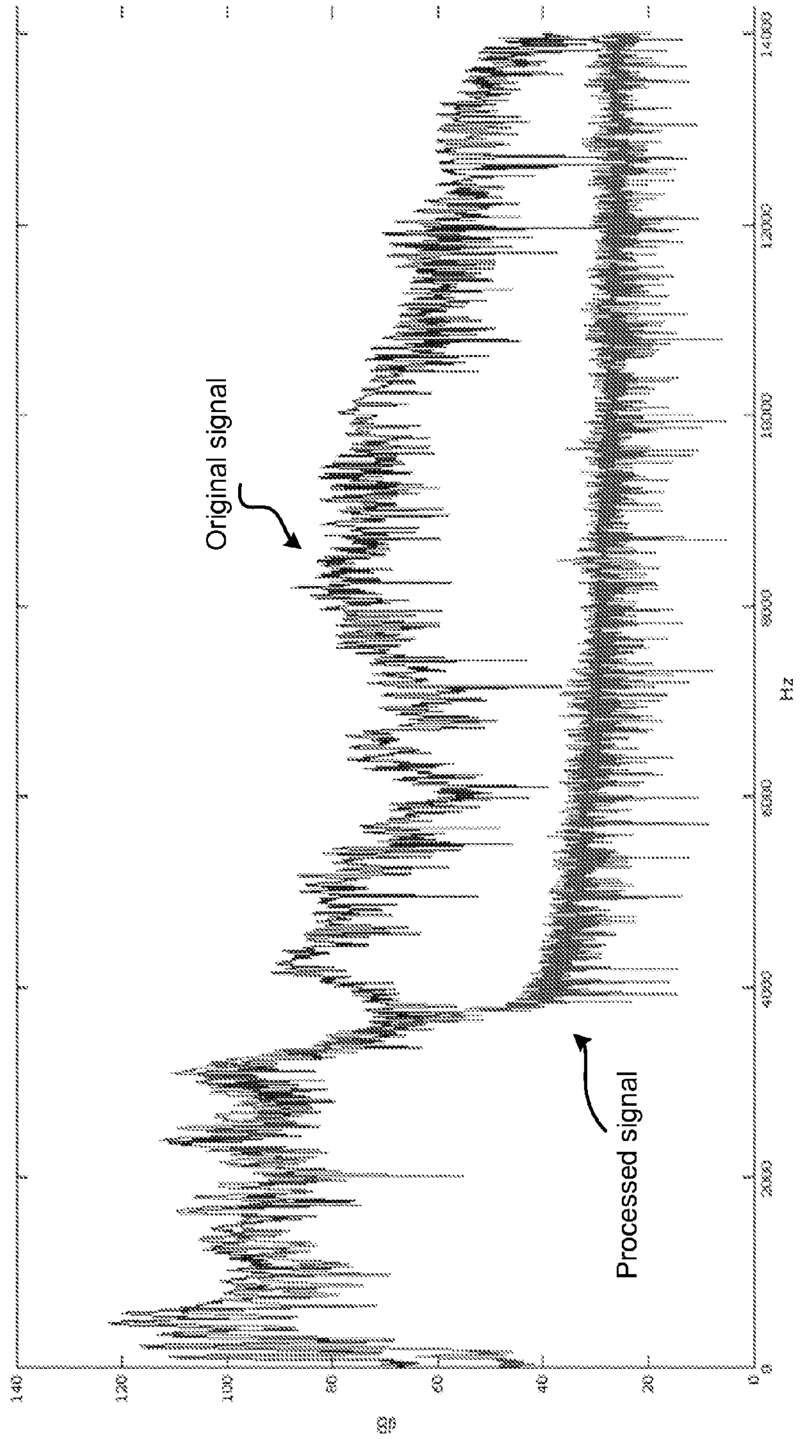
FIG. 2 shows an IRS processed signal (frequencies below 150 Hz and above 3500 Hz are attenuated) and an original signal with a frequency up to 14 kHz.

While the invention covers various modifications and alternatives, embodiments of the invention are shown in the drawings and will hereinafter be described in detail. However it is to be understood that the specific description and drawings are not intended to limit the invention to the specific forms disclosed. On the contrary, it is intended that the scope of the claimed invention includes all modifications and alternatives thereof falling within the spirit and scope of the invention as expressed in the appended claims.

Figure 3:
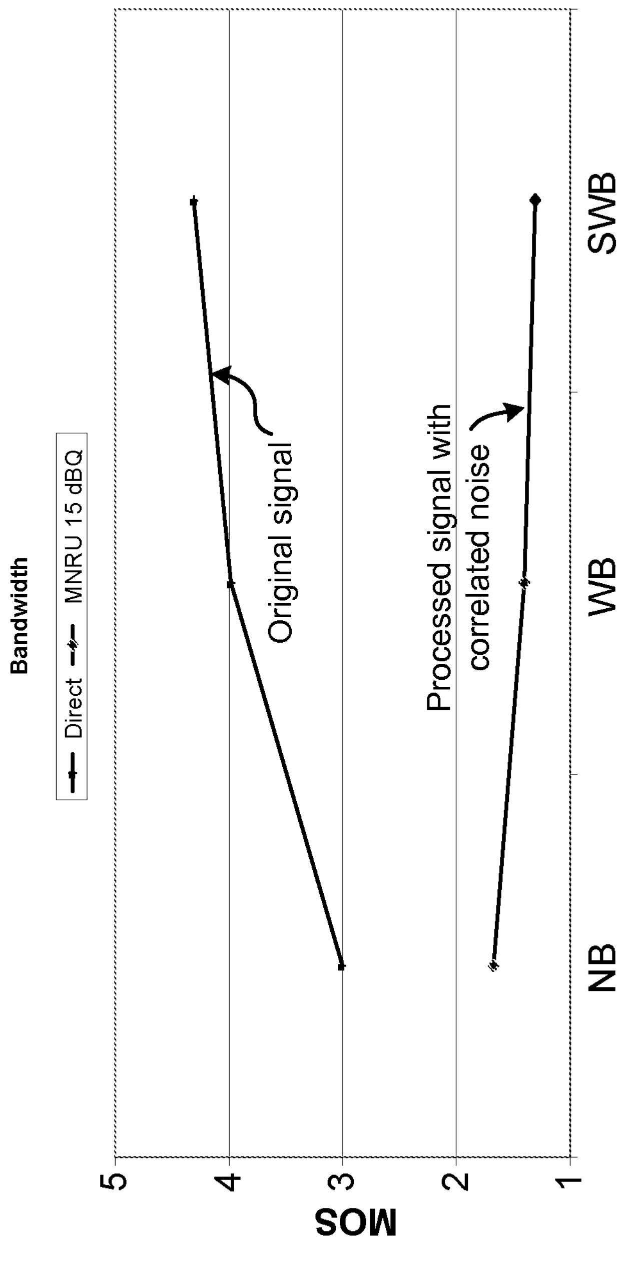
FIG. 3 shows the effect of bandwidth limitations in the presence of speech correlated noise.
Figure 4:
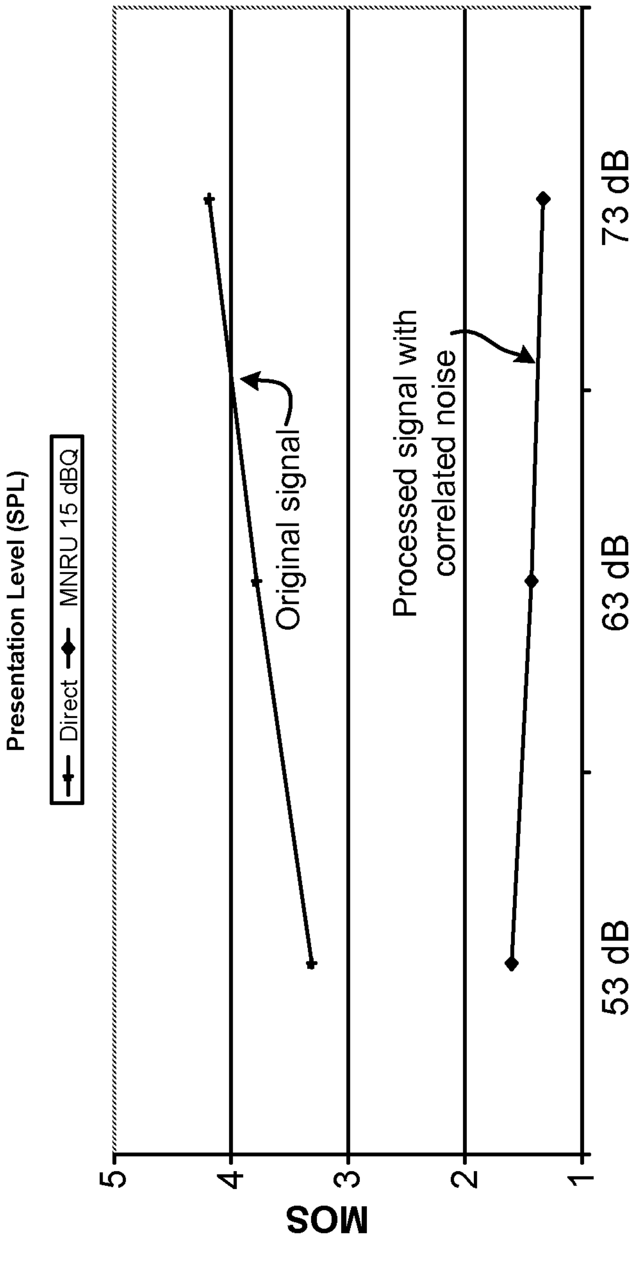
FIG. 4 shows the effect of presentation level variations in the presence of speech correlated noise.

Presentation level variations and bandwidth limitations are typical distortions in a speech communication system/telecommunication network. In the presence of coding distortions, relation between the bandwidth and the presentation level degradations and perceived quality becomes non-linear. This is illustrated in FIG. 3 and FIG. 4, wherein both figures quality is shown in a MOS (Mean Opinion Score) scale, and coding distortion is modeled with an MNRU (Modulated noise reference unit at 15 dBQ. For a clean original signal (upper curve) higher bandwidth means higher quality, while for a signal with correlated noise this effect is reversed (lower curve). Three typical signals have been plotted in FIG. 3: an NB signal with no frequency component above 4 kHz, a WB (Wideband) signal with no frequency component above 7 kHz and an SWB (Super Wideband) signal with no frequency component above 14 kHz. All these follow from the definition of bandwidth, and their higher cutoff frequency, 4, 7, or 14 kHz. As illustrated in FIG. 4, louder signal means higher quality for a clean original signal, while for a signal with correlated noise louder signal means lower quality. The SPL (sound pressure level) is a logarithm of a sound intensity level, relative to a pre-defined intensity level.

MOS is a listening test described in [8] ITU-T Rec. P.800 (August 1996), Methods for Subjective Determination of Transmission Quality. Listeners grade the signal quality on a scale 1 to 5, with the meaning 1 (bad), 2 (poor), 3 (fair), 4 (good), 5 (excellent). MNRU is a method to introduce controlled degradation in the speech signals, typically used as an anchor condition in listening tests. The speech signal is degraded by mixing it with a speech correlated noise, at a pre-defined level. Perceptually it mimics the effect of quantization noise, introduced by the speech compression system. The method is described in [9] ITU-T P.810 (February 1996), Telephone Transmission Quality, Methods for Objective and Subjective assessment of Quality, Modulated Noise Reference Unit (MNRU).

In the existing solutions mentioned above, the non-linear interactions between different quality dimensions is either not captured (documents [2]-[5]), or blindly modeled by means of artificial neural networks as in document [6]. Ignoring these effects or even using a simple linear model does not work, as illustrated in FIG. 3 and FIG. 4. Automatic training of complex classifier, as in document [6], comes at a cost of decreased performance on unknown data types. In practice the performance of the method described in document [6] may even be lower than the much simpler models disclosed in documents [2]-[5].

It is therefore suggested according to the invention an inclusion of a bandwidth related distortion parameter (BW) and a presentation level distortion parameter (PL) in a speech quality estimation measurement. This inclusion preserves much of the linear model/modeling possibility, which in turn provides enhanced stability in speech quality estimation systems. The BW and the PL contribute to the general quality of a signal quality measure (Q) in a semi-linear model, with coefficients $\omega_i$ where i={1, 2} dependent on the level of a coding distortion parameter $Q_{COD}$, see Equation 1 and 2.

$$Q=Q_{COD}+\omega_1 BW+\omega_2 PL \tag{1}$$

$$\omega_i = \begin{cases} \|Q_{COD}-\gamma_i\|^{\alpha_i} & \text{if } Q_{COD} > \gamma_i \\ -\|Q_{COD}-\gamma_i\|^{\beta_i} & \text{if } Q_{COD} < \gamma_i \\ 0 & \text{if } Q_{COD} = \gamma_i \end{cases} \tag{2}$$

Here the coefficients $\gamma_i$, $\beta_i$ and $\alpha_i$ are coefficients trained against subjective data/empirically determined e.g. by quality grades from listening test. The range for the coefficients $\omega_1$, $\omega_2$ depends on the range of $Q_{COD}$, the PL and the BW. As an example, if {$Q_{COD}$, PL, BW} are between 0 to 1; then the coefficients $\omega_1$, $\omega_2$ may be between −1 to 1. The coefficients $\omega_1$, $\omega_2$ are optimized to maximize prediction accuracy between an original quality and a predicted quality. The optimization can be performed in different ways known to the skilled person, but an example is to minimize the mean square error between objective quality and subjective quality, where the objective quality is a value retrieved from a computation by a computer and the subjective quality is a value retrieved via tests where humans judge the quality.

From equation (2) one can see that bandwidth and the presentation level degradations can contribute positively or negatively, based on the level of coding noise. The coding distortion $Q_{COD}$ can be determined from the codec bit-rate, perceptual model such as PESQ in document [2], or measured directly on the speech signal, e.g., through an average spectral flatness, see equation (3).

$$Q_{COD} = \frac{1}{N}\sum_{n=1}^{N} \frac{\exp\left(\frac{1}{W}\sum_{f=1}^{W}\log(P(n, f))\right)}{\frac{1}{W}\sum_{f=1}^{W} P(n, f)} \tag{3}$$

The $Q_{COD}$ might represent an overall coding distortion, or just a certain quality dimension, like noisiness, spectral outliers, etc. In Equation 3, N is a number of frames/blocks in the speech signal and W is a number of frequency bands wherein the N and the W are related to a codec bit rate with n being a time frame/frame index/frame counter value and f being a frequency counter/band index value, and P represents power spectrum of the speech signal.

Figure 5:
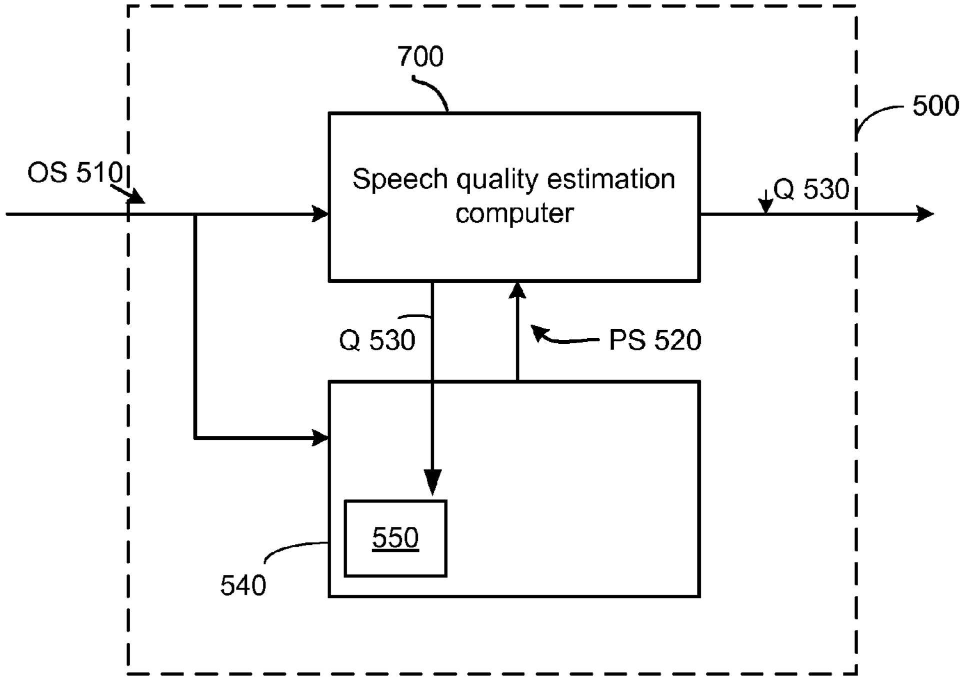
FIG. 5 shows an embodiment of a speech quality estimation system.
Figure 6:
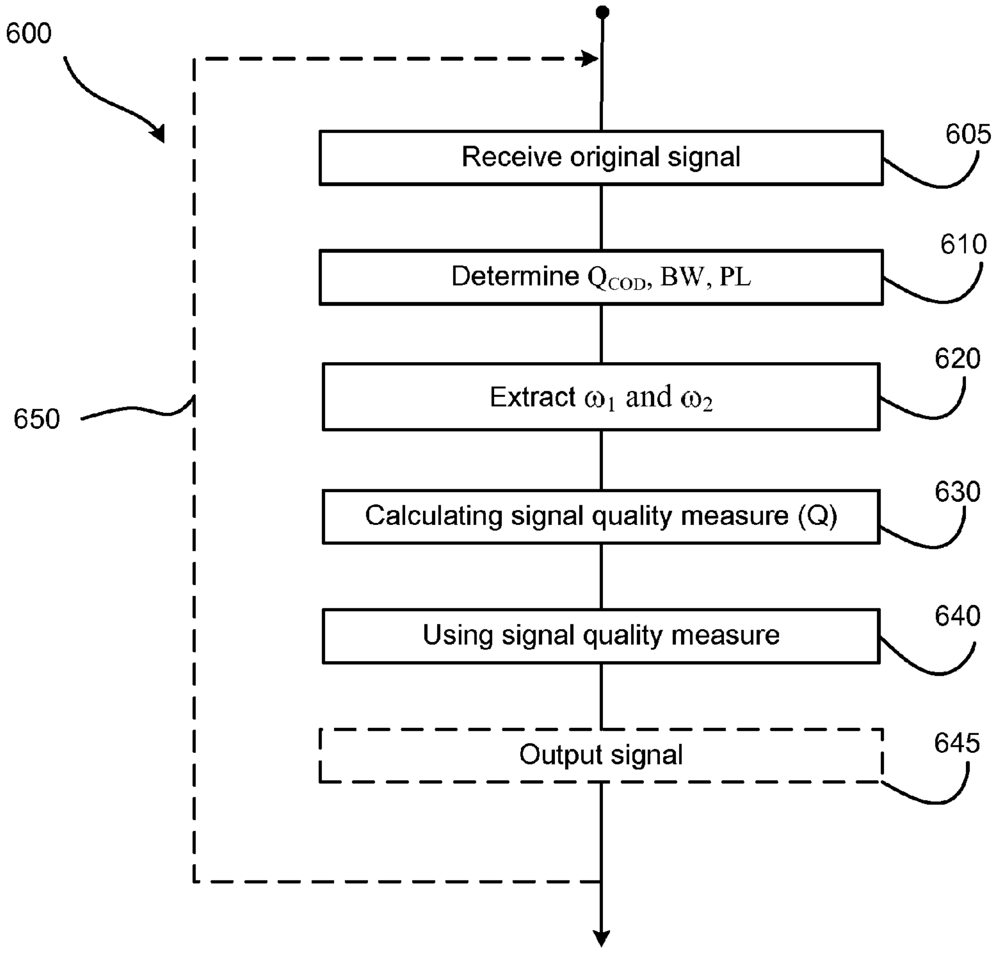
FIG. 6 shows a flow diagram with steps for calculating a Q.

FIG. 5 shows an embodiment with a speech quality estimation system 500. The speech quality estimation system 500 comprises a telecommunications network 540 and a computer 700 for speech quality estimation, here in the form of a speech quality estimation server (SQES). The SQES is here connected to two points in the telecommunications network 540, i.e. the SQES receives an original signal (OS) 510 and a processed signal (PS) 520 as input. The processed signal has been processed by at least one node in the telecommunications network 540, e.g. a transmission or compression device, which causes BW and PL variations. The OS 510 is fed into the SQES and in the telecommunications network 540. The PS520 is an output from the telecommunications network 540. The SQES outputs a Q 530 which either alone or in combination with additional signal quality values known in the art may be a total overall measure of signal quality. The Q 530 is derivable using equation 1. In other words the Q 530 is a weighted sum of {$Q_{COD}$, PL, BW} or a projection of {$Q_{COD}$, PL, BW}. A flow 600 is illustrated in FIG. 6 and describes the steps involved in the generation of Q 530 as shown in FIG. 5 also discloses a second computer 550, here positioned in the communications network 540. The second computer is adapted to receive and optionally store Q, e.g. in the form of a dB-value or any value derived therefrom known to a person skilled in the art. Based upon the received Q the second computer 550 may initiate or adapt an internal process or initiate an adaptation or start of an external process executed by other nodes in the communications network 540.

The Q 530 value can be used to:

monitor the communications network 540 and detect failed network nodes;

optimize the network configuration for best perception quality;

optimize speech codecs, noise suppression systems, etc;

assessment of implementation, i.e. floating and fixed point implementation, of the speech quality estimation procedures.

Figure 5A:
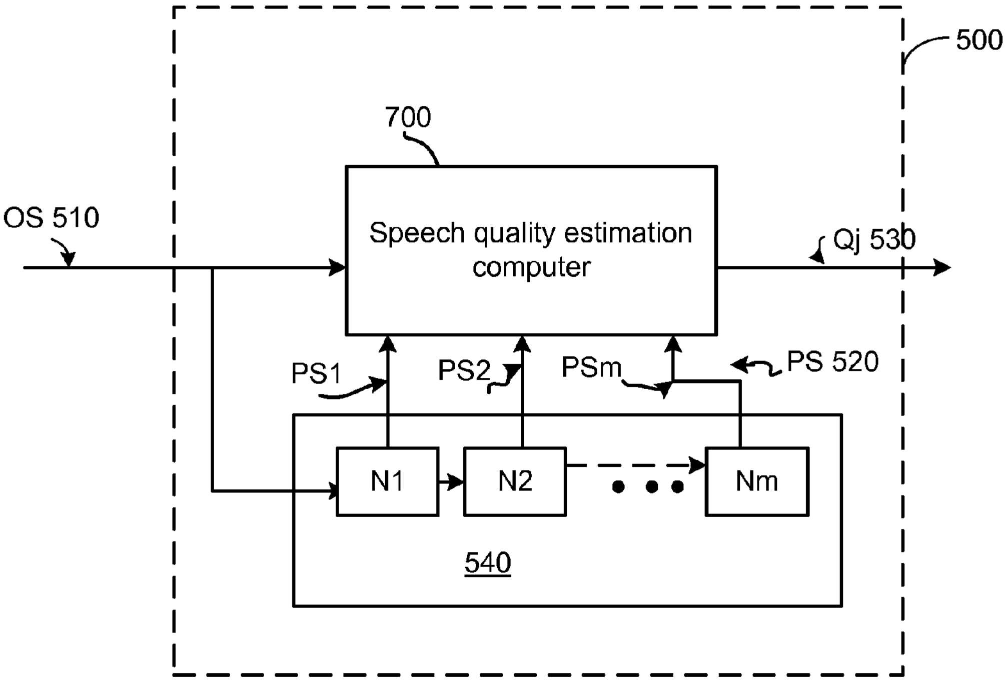
FIG. 5*a* shows another embodiment of the speech quality estimation system.

FIG. 5*a* shows another embodiment of the speech quality estimation system 500. In the telecommunications network 540, the OS 510 may be transcoded/altered at different sub-systems /network nodes i.e. N1, N2, . . . Nm and consequently the PS1, PS2, . . . PSm generated signals may be fed into the computer 700. This resulting in the Qj 530(where j=1, 2, . . . m), i.e. for the different/individual sub-systems i.e. N1, N2, . . . Nm of the telecommunications network 540. So the OS 510 is fed into the SQES and also fed into the sub-system N1 of the telecommunications network 540. The output Q1 530 then is measure of signal quality for the sub-system N1 of the telecommunications network 540. This can be repeated for the sub-systems N2 . . . Nm. The flow 600 is illustrated in FIG. 6 and describes that the steps involved in the Q 530 generation may include the repeat procedure for the sub-systems described above in conjunction with FIG. 5*a*.

FIG. 6 describes procedural steps for calculating the Q 530 according to an embodiment of the speech quality estimation system 500 described above. In a first step 605, the computer 700 receives the OS 510 and PS 520. In a second step 610, the computer 700 determines a first set of parameters of the speech signal, wherein the first set of parameters comprises the coding distortion parameter $Q_{COD}$, the BW and the PL. As stated above, there are different ways to determine $Q_{COD}$, e.g. via a calculation using equation (3). The presentation level can be determined as the active speech level calculated as in document [1], chapter 5.1-5.3 or any approximate equivalents described in document [1], chapter 6. In other words, as is known to the skilled person, the PL is related to the active speech level measured by integrating a quantity proportional to instantaneous power over an aggregate of time during which the speech in question is present and then expressing the quotient, proportional to total energy divided by active time, in decibels relative to a reference. The PL is in one embodiment of the invention the difference between the presentation level of a reference signal and the presentation level of the speech signal, i.e. the difference between a 'clean' original signal OS and the processed signal PS illustrated in FIGS. 5 and 5*a*. The BW can be determined as the difference between a bandwidth value of a reference signal and the speech signal, i.e. the bandwidth difference between the original signal OS and the processed signal PS. The bandwidth value of the speech signal can be calculated in the same way as the Model Output Variable Bandwidth Test$_B$ in document [6], i.e. in the way illustrated in Chapter 4.4.1. in document [6]. In a third step 620, the computer 700 extracts a second set of parameters, here $\omega_1$, $\omega_2$ from said first set of parameters, e.g. by a calculation according to Equation (2). In a fourth step 630, the computer 700 calculates the Q 530 from the first set of parameters and the second set of parameters, said signal quality measure being derived from Equation (1) whereby improving a quality estimation of the speech signal using the Q 530 of said speech signal. In an optional fifth step 640, the computer uses Q 530 in the quality estimation system, i.e. as an improved quality measure over quality values of prior art. The Q could in some embodiments of course be a part of a calculation of further quality values, e.g. a second signal quality measure being a sum, e.g. a weighted sum, of a plurality of quality measures where the other quality measures are generated according to known methods. In other words, the computer 700 improves a signal quality measure for the speech quality estimation system 500. In an optional sixth step 645, the Q 530 may be output as an output signal. The output signal may be stored in the computer 700, e.g. in a volatile or non-volatile memory such as the computer program product 710 (see FIG. 8). The output signal may be stored in the computer 550, which of course also may be used for speech quality estimation in the speech quality estimation system 500. The output signal may alternatively be stored partly in the 700 and partly on the second computer 550. It should be understood that the sixth step 645 in some embodiments are made without having performed the fifth step 640, i.e. in some embodiments the computer 700 sends the Q 530 to the second computer 550, which in turn uses the Q 530 to assess the quality of the speech signal. In an optional seventh step 650, according to the embodiment related to the subsystem N1, N2, . . . Nm in FIG. 5*a*, the steps 610-645 may be repeated m times for improving speech quality for the subsystems described earlier.

Figure 7:
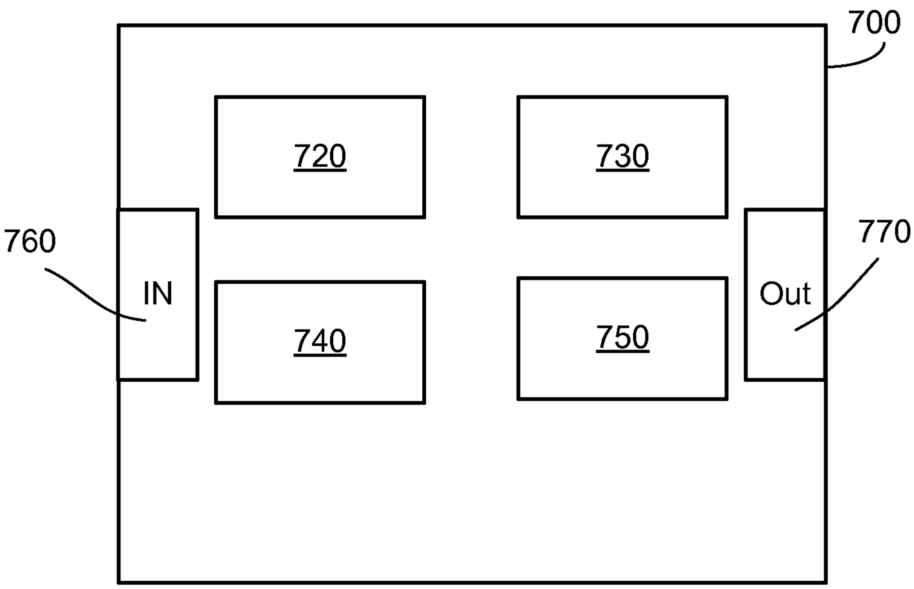
FIG. 7 shows an embodiment of a computer for signal quality estimation.

FIG. 7 shows schematically an embodiment of the computer 700 in the form of the SQES. The SQES has a

- determining unit 720 that performs the step 610;
- extracting unit 730 that performs the step 620;
- calculating unit 740 that performs the step 630;
- speech quality estimation unit 750 that performs the step 640;
- an input unit 760 and an output unit 770.

Although the respective unit disclosed in conjunction with FIG. 7 have been disclosed as physically separate units in the computer 700, and all may be special purpose circuits such as ASICs (Application Specific Integrated Circuits), the invention covers embodiments of the computer 700 where some or all of the units are implemented as computer program modules running on general purpose processor. Such an embodiment is disclosed in conjunction with FIG. 8.

Figure 8:
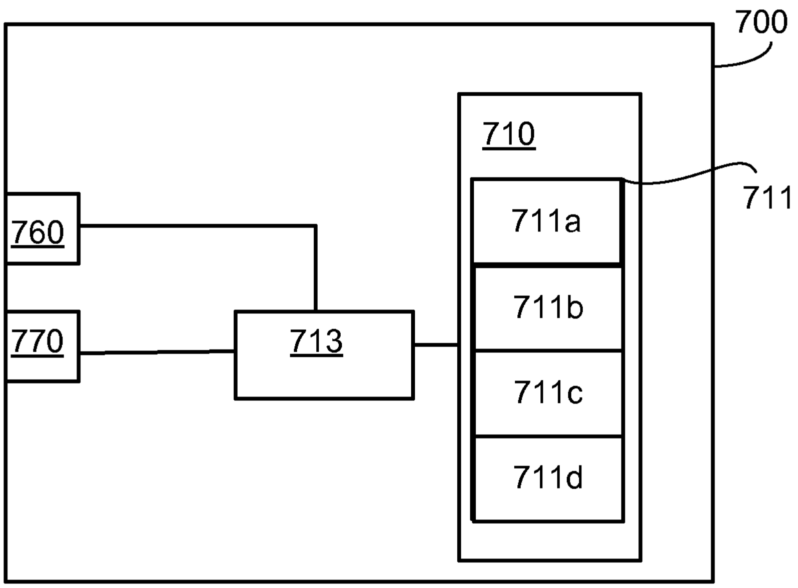
FIG. 8 shows an embodiment of a computer for signal quality estimation.

FIG. 8 schematically shows an embodiment of the computer 700 in the form of the SQES, which also can be an alternative way of disclosing an embodiment of the SQES illustrated in FIG. 7. Comprised in the SQES are here a processing unit 713 e.g. with a DSP (Digital Signal Processor) and an encoding and a decoding module. The processing unit 713 can be a single unit or a plurality of units for performing different steps of procedures described herein. The SQES also comprises the input unit 760 for receiving the OS 510 and the PS 520 and the output unit 770 for the output of Q 530 in step 645 discussed above. The input unit 760 and the output unit 770 may be arranged as one, i.e. as a single port, in the hardware of the SQES.

Furthermore the SQES comprises at least one computer program product 710 in the form of a non-volatile memory, e.g. an EEPROM (Electrically Erasable Programmable Read-only Memory, a flash memory and a disk drive. The computer program product 710 comprises a computer program 711, which comprises code means which when run on the SQES causes the SQES to perform the steps of the procedures described above in conjunction with FIG. 6. Hence in the exemplary embodiments described, the code means in the computer program 711 of the SQES comprises a determining module 711*a* for determining the first set of parameters comprising $Q_{COD}$, BW and PL, an extracting module 711*b* for extracting the second set of parameters comprising $\omega_1$, $\omega_2$ from said first set of parameters; a calculating module 711*c* for determining the Q 530 of said speech signal and a speech quality estimation module 711*d* for improving the quality estimate based on at least Q 530. The modules 711*a*-*d* essentially perform the steps of flow 600 when run on the processing unit 713 to realize the computer 700 described in FIG. 7. In other words, when the different modules 711*a*-711*d* are run on the processing unit 713, they correspond to the corresponding units 720, 730, 740 and 750 of FIG. 7.

Although the code means in the embodiment disclosed above in conjunction with FIG. 8 are implemented as computer program modules which when run on the SQES causes the SQES to perform steps described above in the conjunction with figures mentioned above, at least one of the code means may in alternative embodiments be implemented at least partly as hardware circuits.

The presented scheme for incorporating effects of the BW and the PL degradations allows keeping a semi-linear model in the quality assessment algorithm, which guarantees stable performance with unknown data. The presented scheme can be used as an extension to any of the existing standards for speech quality assessment such as the PESQ in document [2], PEAQ (Objective Measurements of Perceived Audio Quality) in document [6], MNB (Measuring Normalizing Block) in document [4] and P.563 in document [5].

A further embodiment of the invention is a method for a speech quality estimation system, comprising a speech quality estimation computer, e.g. in the form of a SQES. The method comprises steps, performed by the speech quality estimation computer, of:

- determining a first set of parameters of a signal, wherein the first set of parameters comprises a coding distortion parameter $Q_{COD}$, a bandwidth related distortion parameter BW and a presentation level distortion parameter PL;
- extracting a second set of parameters $\omega_1$, $\omega_2$ from said first set of parameters;

calculating a Q from the first set of parameters and the second set of parameters, said signal quality measure being derived from $$Q_{COD}+\omega_1\cdot BW+\omega_2\cdot PL$$

improving a quality estimation of the signal using the Q of said signal.

For a positive $\omega_1$, $\omega_2$ value, the Q of said signal improves/increases as the sum of distortion decreases. For a negative $\omega_1$, $\omega_2$ value, the Q of said signal decreases/degrades as the sum of distortion decreases.

In another embodiment of the invention, there exist provisions for an arrangement comprising a speech quality estimation computer, e.g. a SQES, adapted for being connected to a communications network. The speech quality estimation computer comprises:

a determining unit for determining a first set of parameters of a signal, wherein the first set of parameters comprises a coding distortion parameter $Q_{COD}$, a bandwidth related distortion parameter BW and a presentation level distortion parameter PL;

an extracting unit for extracting a second set of parameters $\omega_1$, $\omega_2$from said first set of parameters;

a calculating unit for calculating a Q from the first set of parameters and the second set of parameters, said signal quality measure being derived from $$Q_{COD}+\omega_1\cdot BW+\omega_2\cdot PL$$

an improving unit for improving a quality estimation of the signal using the Q of said signal.

In another embodiment of the invention, there exists provisions for a computer program for a speech quality estimation, the computer program comprises code means which when run on a speech quality estimation computer connected to a communications network, causes the speech quality estimation computer to:

determine a first set of parameters $Q_{COD}$, BW, PL of a signal, wherein the first set of parameters comprises a coding distortion parameter $Q_{COD}$, a bandwidth related distortion parameter BW and a presentation level distortion parameter PL;

extract a second set of parameters $\omega_1$, $\omega_2$ from said first set of parameters;

calculate a signal quality measure Q from the first set of parameters and the second set of parameters, said signal quality measure being derived from $$Q_{COD}+\omega_1\cdot BW+\omega_2\cdot PL$$

improve a quality estimation of the signal using the Q of said signal.

The invention claimed is:

1. A method performed by a computer for speech quality estimation, wherein the computer comprises a processor performing the steps of:

determining a coding distortion parameter ($Q_{COD}$), a bandwidth related distortion parameter (BW) and a presentation level distortion parameter (PL) of a speech signal;

extracting a first coefficient ($\omega_1$) and a second coefficient ($\omega_2$), the first coefficient ($\omega_1$) and the second coefficient ($\omega_2$) being dependent on the coding distortion parameter ($Q_{COD}$);

calculating a signal quality measure (Q), where the signal quality measure is calculated based on $$Q_{COD}+\omega_1\cdot BW+\omega_2\cdot PL, \text{ and}$$

using the signal quality measure (Q) in a quality estimation of the speech signal.

2. A method according to claim 1, wherein the step of extracting the first coefficient ($\omega_1$) and the second coefficient ($\omega_2$) is performed by calculating $\omega_i$ based on $$\|Q_{COD}-\gamma_i\|^{\alpha_i} \text{ for } Q_{COD}>\gamma_i$$

where i={1,2} and wherein γ and α are trained or empirically determined coefficients.

3. A method according to claim 1, wherein the step of extracting the first coefficient ($\omega_1$) and the second coefficient ($\omega_2$) is performed by calculating $\omega_i$ based on $$-\|Q_{COD}-\gamma_i\|^{62\ i} \text{ for } Q_{COD}<\gamma_i$$

where i={1, 2} and wherein γ and β are trained or empirically determined coefficients.

4. A method according to claim 1, wherein the step of extracting the first coefficient ($\omega_1$) and the second coefficient ($\omega_2$) is performed by calculating the first coefficient ($\omega_1$) and the second coefficient ($\omega_2$) according to $$\omega_i = \begin{cases} \|Q_{COD}-\gamma_i\|^{\alpha_i} & \text{if } Q_{COD}>\gamma_i \\ -\|Q_{COD}-\gamma_i\|^{\beta_i} & \text{if } Q_{COD}<\gamma_i \\ 0 & \text{if } Q_{COD}=\gamma_i \end{cases}$$

where i={1, 2} and γ, α and β are trained or empirically determined coefficients.

5. A method according to claim 1, wherein the coding distortion parameter ($Q_{COD}$) is determined by extracting the coding distortion parameter ($Q_{COD}$) from $$\frac{1}{N}\sum_{n=1}^{N}\frac{\exp\left(\frac{1}{W}\sum_{f=1}^{W}\log(P(n,f))\right)}{\frac{1}{W}\sum_{f=1}^{W}P(n,f)}$$

wherein N is a number of frames or blocks in the speech signal, W is a number of frequency bands, wherein the N and the W are related to a codec bit rate with n being a time frame, frame index or frame counter value, and f being a frequency counter or band index value, and P represents power spectrum of the speech signal.

6. A method according to claim 1, where the signal quality measure (Q) is used to:

monitor a communications network (540) and detect failed network nodes;

optimize network configuration for the communications network for improved perception quality;

optimize a speech codec;

optimize noise suppression systems; or assess floating and fixed point implementation of speech quality estimation procedures.

7. A computer for speech quality estimation, the computer being adapted for being connected to a communications network, wherein the computer comprises:

at least one processor configured to perform operations comprising:

determining a coding distortion parameter ($Q_{COD}$), a bandwidth related distortion parameter (BW) and a presentation level distortion parameter (PL) of a speech signal;

extracting a first coefficient ($\omega_1$) and a second coefficient ($\omega_2$), the first coefficient ($\omega_1$)and the second coefficient ($\omega_2$) being dependent on the coding distortion parameter ($Q_{COD}$);

calculating a signal quality measure (Q), where the signal quality measure (Q) is calculated based on $$Q_{COD}+\omega_1\cdot BW+\omega_2\cdot PL; \text{ and}$$

outputting the signal quality measure (Q) in order for the signal quality measure (Q) to be stored in a second computer.

8. A computer according to claim 7, wherein the at least one processor is further configured to use the signal quality measure (Q) to estimate a speech quality of the speech signal.

9. A computer according to claim 7, wherein the at least one processor is further configured to receive an original signal and a processed signal of the original signal.

10. A computer according to claim 7, wherein the at least one processor is further configured to extract the first coefficient ($\omega_1$) and the second coefficient ($\omega_2$) by calculating $\omega_i$, based on $$\|Q_{COD}-\gamma_i\|^{\alpha_i} \text{ for } Q_{COD}>\gamma_i$$

where i={1,2} and wherein $\gamma$ and $\alpha$ are trained or empirically determined coefficients.

11. A computer according to claim 7, wherein the at least one processor is further configured to extract the first coefficient ($\omega_1$) and the second coefficient ($\omega_2$) by calculating $\omega_1$ based on $$-\|Q_{COD}-\gamma_i\|^{62\ i} \text{ for } Q_{COD}<\gamma_i$$

where i={1, 2} and wherein $\gamma$ and $\beta$ are trained or empirically determined coefficients.

12. A computer program product for speech quality estimation, comprising computer program code on a tangible non-transitory computer readable medium which, when run on a computer connected to a communications network (540), causes the computer to:

determine a coding distortion parameter ($Q_{COD}$), a bandwidth related distortion parameter (BW) and a presentation level distortion parameter (PL) of a speech signal;

extract a first coefficient ($\omega_1$) and a second coefficient ($\omega_2$), the first coefficient ($\omega_1$) and the second coefficient ($\omega_2$) being dependent on the coding distortion parameter;

calculate a signal quality measure (Q), where the signal quality measure is calculated based on $$Q_{COD}+\omega_1\cdot BW+\omega_2\cdot PL\text{; and}$$

use the signal quality measure (Q) in a quality estimation of the speech signal.

13. A computer program product according to claim 12, comprising computer program code on the tangible non-transitory computer readable medium which, when run on the computer, causes the computer to extract the first coefficient ($\omega_1$) and the second coefficient ($\omega_2$) by calculating the first coefficient ($\omega_1$) and the second coefficient ($\omega_2$) according to $$\omega_i = \begin{cases} \|Q_{COD}-\gamma_i\|^{\alpha_i} & \text{if } Q_{COD}>\gamma_i \\ -\|Q_{COD}-\gamma_i\|^{\beta_i} & \text{if } Q_{COD}<\gamma_i \\ 0 & \text{if } Q_{COD}=\gamma_i \end{cases}$$

where i={1, 2} and $\gamma$, $\alpha$ and $\beta$ are trained or empirically determined coefficients.

14. A computer program product according to claim 12, comprising computer program code on the tangible non-transitory computer readable medium which, when run on the computer, causes the computer to determine the coding distortion parameter ($Q_{COD}$) by extracting the coding distortion parameter ($Q_{COD}$) from $$\frac{1}{N}\sum_{n=1}^{N}\frac{\exp\left(\frac{1}{W}\sum_{f=1}^{W}\log(P(n,f))\right)}{\frac{1}{W}\sum_{f=1}^{W}P(n,f)}$$

wherein N is a number of frames or blocks in the speech signal, W is a number of frequency bands, wherein the N and the W are related to a codec bit rate with n being a time frame, frame index or frame counter value, and f being a frequency counter or band index value, and P represents power spectrum of the speech signal.

* * * * *